United States Patent [19]

Rosen

[11] Patent Number: 4,794,261
[45] Date of Patent: Dec. 27, 1988

[54] RADIATION PROTECTION CIRCUIT FOR PROTECTION AGAINST GAMMA RAY AND NEUTRON RADIATION

[75] Inventor: Arye Rosen, Cherry Hill Township, Camden County, N.J.

[73] Assignee: General Electric Company, Schenectady, N.Y.

[21] Appl. No.: 41,941

[22] Filed: Apr. 24, 1987

[51] Int. Cl.⁴ .............................................. G02B 27/00
[52] U.S. Cl. ................................. 250/551; 250/214 C
[58] Field of Search ................ 250/213 VT, 214 AG, 250/214 C, 551; 307/311; 315/224, 241 P, 295, 297, DIG. 5

[56] References Cited

U.S. PATENT DOCUMENTS

| | | | |
|---|---|---|---|
| 3,480,781 | 11/1969 | Mandalakas | 250/214 C |
| 3,539,809 | 11/1970 | Lokerson | 250/83.3 |
| 4,045,675 | 8/1977 | Kingsley et al. | 250/370 |

OTHER PUBLICATIONS

A. B. Przedpelski, "PIN Diode Switches-Part II", *R. F. Design*, Feb. 1987, pp. 89 & 90.
A. Rosen et al., "High Powered Low-Loss PIN Diodes for Phased-Array Radar", *RCA Review*, Mar. 1979, vol. 40, No. 1, pp. 22–58.

Primary Examiner—David C. Nelms
Assistant Examiner—Stephone B. Allen
Attorney, Agent, or Firm—Henry I. Steckler; James C. Davis, Jr.; Paul R. Webb, II

[57] ABSTRACT

A circuit for protecting a protected circuit against radiation has a PIN diode series coupled to a laser, which is optically coupled to a photodiode. The photodiode is coupled to the protected circuit. When radiation occurs, the resistance of the PIN diode increases, which causes the laser to cease emitting light. In turn, the resistance of the photodiode increases, thereby decreasing the current from a power supply through the protected circuit.

9 Claims, 1 Drawing Sheet

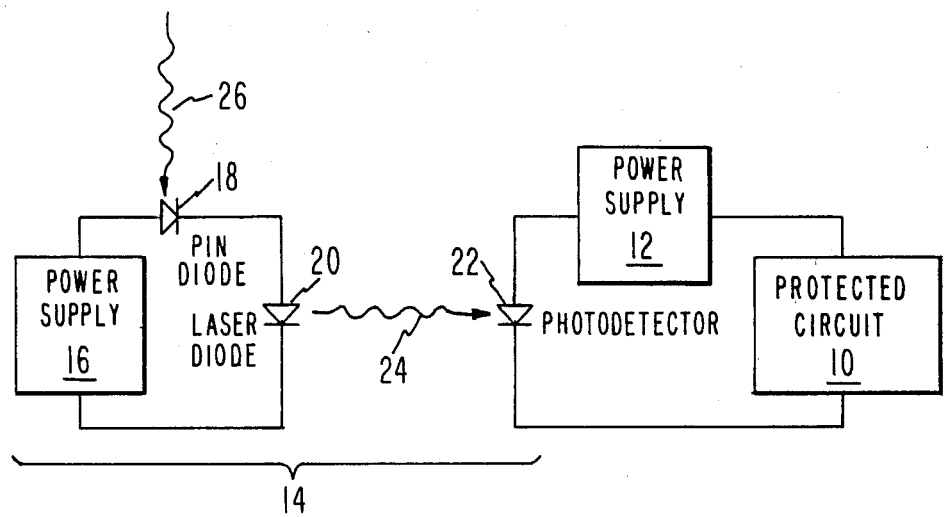

RADIATION PROTECTION CIRCUIT FOR PROTECTION AGAINST GAMMA RAY AND NEUTRON RADIATION

BACKGROUND OF THE INVENTION

The present invention relates to a circuit for protecting a device, and more particularly, for protecting a device or complex system against radiation.

Electronic components or devices are sensitive to radiation, such as gamma rays and neutrons, which radiation causes a change in operating characteristics. In particular, radiation, if intense enough and for a long enough duration, can cause a total failure of some electric components due to excessive heat dissipation. The possibility of this happening is especially high for sensitive devices such as positive conductivity type-intrinsic-negative conductivity type (PIN) diodes. These diodes are used in applications such as electronic phase shifters. If the PIN diodes are rendered inoperable, they must be replaced, which is time consuming and therefore costly.

SUMMARY OF THE INVENTION

A circuit comprises at least one radiation sensitive circuit to be protected against radiation, and protection means, series coupled to said radiation sensitive circuit, for providing an impedance that increases with increases in radiation.

BRIEF DESCRIPTION OF THE DRAWING

The sole FIGURE is a partly block and partly schematic diagram of an embodiment of the invention.

DETAILED DESCRIPTION OF THE PREFERRED EMBODIMENT

The drawing shows a radiation sensitive circuit 10 to be protected against radiation, a first power supply 12 series coupled to the circuit 10, and a protection means or circuit 14 coupled to the supply 12 and the circuit 10. While the circuit 10 can comprise a single device, it more typically comprises a complex system such as numerous PIN diodes used to shift te phase of signals supplied to, or received from, a radar antenna, and hence shift the directional pattern of the antenna, as known in the art. For this application the power supply 12 typically supplies about 1000 volts and at about 10 amperes, the exact values depending upon the radiated power level and the amount of desired phase shift.

The protection means 14 comprises a second power supply 16, typically providing between about 100 to 150 volts at between about 2 to 3 amperes, a radiation sensitive element 18, such as a silicon or GaAs PIN diode, coupled to the power supply 16, a threshold device 20 such as a laser diode, which is not as sensitive to radiation as the PIN diode 18 and which is coupled thereto and to the power supply 16, and a photodetector 22, such as a photodiode, optically coupled to the laser 20 and electrically series coupled to the first power supply 12 and the protected circuit 10. As known in the art, a PIN diode comprises three semiconductor layers, i.e., a layer doped with a P-type conductivity modifier, such as boron, an intrinsic layer adjacent the P-layer, and a layer doped with an N-type conductivity modifier, such as phosphorus adjacent the I-layer. In particular, as wide an I-layer as practical, i.e., about 400 micrometers ($\mu$m), is desired for the PIN diode 18 in order to maximize the radiation sensitivity. This is in distinction to any PIN diodes that are present in the protected circuit 10, which should have as narrow an I-layer as practical, i.e., about 25 to 75 $\mu$m, in order to be radiation hard.

In operation, when no radiation is present, the resistance of the PIN diode 18 is low, e.g., about 0.5 ohm, and thus nearly the full voltage from the second power supply 16 is applied to the laser 20. The current from the supply 16 is chosen to be slightly above the threshold current of the laser 20. In turn, the laser 20 emits photons indicated by a beam 24 towards the photodiode 22, which thereby has a low impedance, more particularly a low resistance, e.g., about 2 ohms. Thus the protection means 14 has a low impedance and resistance, and hence nearly the full voltage from the first power supply 12 is applied to the protected circuit 10, thereby allowing normal operation thereof.

When the PIN diode 18 receives structurally damaging radiation 26, such as gamma rays or neutrons, its resistance increases, e.g., about 50 to 100 ohms, due to a decrease in carrier lifetime, thereby lowering the current through the laser 20. Due to the threshold characteristic of the laser 20, a relatively small current drop therethrough, and hence a relatively small amount of radiation received by the PIN diode 18, will cause it to cease emitting photons. The resistance of the photodiode 22 and hence the impedance of the protection means 14, thereby increases. Thus the voltage across, and hence the current through, the circuit 10 caused by the supply 12 goes down, thereby lowering the total heat dissipated by the protected circuit 10. The fact, the photodiode 22 resistance increases so much, e.g., several megohms, it acts essentially as a switch that virtually no current flows through the protected circuit 10 and therefore its heat dissipation is essentially zero. There still will be radiation-induced photocurrents in the circuit 10, but the total current is much lower than without the protection means 14, thereby protecting the circuit 10.

It might be necessary to replace the PIN diode 18 since it can be destroyed by the radiation 26. However this is easier, and hence cheaper, than replacing the numerous elements that typically comprise the protected circuit 10.

What is claimed is:

1. A protection circuit for protecting a protected circuit adapted to be coupled to a first power supply against gamma ray and neutron radiation, said protection circuit comprising:
   a photodiode adapted to be coupled to said protected circuit and said first power supply;
   a laser optically coupled to said photodiode;
   a PIN diode coupled to said laser; and
   a second power supply coupled to said PIN diode and to said laser.

2. A circuit comprising:
   a radiation sensitive circuit to be protected against gamma ray and neutron radiation; and
   protection means, series coupled to said protected circuit, for providing an impedance that increases with increases in gamma ray and neutron radiation.

3. A circuit as claimed in claim 2, wherein said impedance comprises a resistance that increases with increases in radiation.

4. A circuit as claimed in claim 2, wherein said circuit to be protected comprises at least one PIN diode.

5. A circuit as claimed in claim 2, wherein said protection means comprises a photodetector.

6. A circuit as claimed in claimed 2, wherein said protection means comprises a threshold device.

7. A circuit as claimed in claim 2, wherein said protection means comprises a radiation sensitive element.

8. A circuit as claimed in claim 6, wherein said threshold device comprises a laser diode.

9. A circuit as claimed in claim 7, wherein said element comprises a PIN diode.

* * * * *